(12) United States Patent
Kretz et al.

(10) Patent No.: US 7,919,825 B2
(45) Date of Patent: *Apr. 5, 2011

(54) THIN FILM TRANSISTORS WITH POLY(ARYLENE ETHER) POLYMERS AS GATE DIELECTRICS AND PASSIVATION LAYERS

(75) Inventors: Christine Peck Kretz, Macungie, PA (US); William Franklin Burgoyne, Jr., Bethlehem, PA (US); Thomas John Markley, Blandon, PA (US)

(73) Assignee: Air Products and Chemicals, Inc., Allentown, PA (US)

( * ) Notice: Subject to any disclaimer, the term of this patent is extended or adjusted under 35 U.S.C. 154(b) by 759 days.

This patent is subject to a terminal disclaimer.

(21) Appl. No.: 11/752,722

(22) Filed: May 23, 2007

(65) Prior Publication Data

US 2007/0296047 A1    Dec. 27, 2007

Related U.S. Application Data

(60) Provisional application No. 60/810,534, filed on Jun. 2, 2006.

(51) Int. Cl.
*H01L 21/02* (2006.01)
(52) U.S. Cl. .......... 257/410; 257/E51.007; 257/E29.273
(58) Field of Classification Search .................. 257/410, 257/E51.007, E29.273
See application file for complete search history.

(56) References Cited

U.S. PATENT DOCUMENTS

| | | | |
|---|---|---|---|
| 5,144,780 A | 9/1992 | Gieling et al. | |
| 5,179,188 A | 1/1993 | Mercer et al. | |
| 5,874,516 A | 2/1999 | Burgoyne, Jr. et al. | |
| 6,060,170 A | 5/2000 | Burgoyne, Jr. | |
| 6,280,794 B1 | 8/2001 | Tu et al. | |
| 6,713,357 B1 | 3/2004 | Wang et al. | |
| 6,716,955 B2 | 4/2004 | Burgoyne, Jr. | |
| 7,029,945 B2 * | 4/2006 | Veres et al. | 438/99 |
| 7,755,081 B2 | 7/2010 | Wu et al. | |
| 2003/0171527 A1 | 9/2003 | Burgoyne, Jr. | |
| 2004/0068082 A1 | 4/2004 | Lim et al. | |
| 2005/0224922 A1 | 10/2005 | Lyons | |
| 2005/0240002 A1 * | 10/2005 | Burgoyne et al. | 528/425 |
| 2006/0011909 A1 | 1/2006 | Kelley et al. | |
| 2006/0067851 A1 | 3/2006 | Horimura et al. | |
| 2006/0079034 A1 | 4/2006 | Hoffman et al. | |

FOREIGN PATENT DOCUMENTS

CN    1437269    8/2003

(Continued)

OTHER PUBLICATIONS

Standaert, et al "High density plasma patterning of low dielectric constant polymers: A comparison between polytetrafluoroethylene, parylene-N, and poly(arylene ether)," A Vac. Sci. Technology A. 19(2) Mar./Apr. 2001; p. 435-446.

(Continued)

*Primary Examiner* — Trung Dang
(74) *Attorney, Agent, or Firm* — Michael K. Boyer

(57) ABSTRACT

The use of a poly(arylene ether) polymer as a passivation or gate dielectric layer in thin film transistors. This poly(arylene ether) polymer includes polymer repeat units of the following structure:

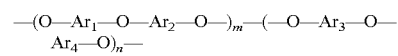

where $Ar_1$, $Ar_2$, $Ar_3$, and $Ar_4$ are identical or different aryl radicals, m is 0 to 1, n is 1−m, and at least one of the aryl radicals is grafted to the backbone of the polymer.

28 Claims, 2 Drawing Sheets

FOREIGN PATENT DOCUMENTS

| | | |
|---|---|---|
| EP | 0 755 957 A | 1/1997 |
| EP | 0 939 096 A2 | 9/1999 |
| JP | 09-202824 A | 5/1997 |
| JP | 11-315139 A | 11/1999 |
| JP | 11-326947 A | 11/1999 |
| JP | 2003-231750 A | 8/2003 |
| JP | 2006-135327 A | 5/2006 |

OTHER PUBLICATIONS

Trabzon, et al; "Damage to sub-half-micron Metal-oxide-silicon field-effect transistors from plasma processing of low-K polymer interlayer dielectics;" Semicond. Sci. Tech., 15 2000, p. 309-314.

U.S. Appl. No. 60/810,534, filed Jun. 2, 2006, Kretz et al.

* cited by examiner

THIN FILM TRANSISTORS WITH POLY(ARYLENE ETHER) POLYMERS AS GATE DIELECTRICS AND PASSIVATION LAYERS

This application claims the benefit of Provisional Application No. 60/810,534, filed Jun. 2, 2006. The disclosure of this Provisional Application is incorporated by reference.

CROSS-REFERENCE TO RELATED APPLICATIONS

The subject matter of the instant invention is related to U.S. Pat. No. 6,716,955; the disclosure of which is hereby incorporated by reference.

BACKGROUND OF THE INVENTION

This invention relates to the use of poly(arylene ether) polymers, and more particularly to the use of grafted functional groups onto the backbone of poly(arylene ether) polymers, to provide cross-linkable polymers with a range of glass transition temperatures and low moisture uptake having particular utility as gate dielectric layers in multilayer electronic devices such as thin film transistors. The invention also relates to methods for applying the polymers in order to form thin film transistors (TFT).

The electronics industry is seeking gate dielectric materials for use in fabricating multilayer electronic devices such as thin film transistors at low temperatures, particularly for printed transistors. However, the need for materials compatibility, processability, and good electrical properties over a wide range of conditions and deposition techniques and temperatures has presented a significant problem. This problem has been a very difficult one to solve for polymers since the desired temperature for their use in flexible or lightweight transistors (i.e. cure) is below 400° C. and more preferably below about 180° C.

Therefore, there is a need in the multilayer electronic device fabrication industry for the replacement of silicon nitride-based gate dielectric materials with materials of lower processing temperatures that may be deposited via solution casting techniques such as spin-coating, slot extrusion, or printing. Silicon nitride and its modified versions are typically processed at temperatures greater than 300° C. and are typically deposited via chemical vapor deposition techniques. While polymeric materials have been discussed as replacements for silica as interlayer dielectrics (ILDs), shallow trench isolation (STI) materials, or stop layer dielectrics (SLDs), they have not traditionally been reported to be used as gate dielectrics due to their lack of hydrophobicity or their inability to crosslink at low temperatures. In particular, polymeric systems such as the ones of the invention described below have not been employed as gate dielectrics that are resistant to solvents, that may be printed or slot extruded, are processable at or below 180 C., and give electrical properties needed in a gate dielectric. Many of the polymers that have been tested as gate dielectric materials for thin film transistors lack the hydrophobicity need to avoid moisture absorption and the ability to withstand contact with other solvents that may be used in depositing subsequent layers and that may damage the gate dielectric layer. Thus, a gate dielectric material that meets that criteria above combined with the crosslinking needed to give good solvent resistance is desirable.

Past attempts to crosslink poly(arylene ethers) utilized various high temperature crosslinking groups to give high Tg polymer and this chemistry may be used as an intra- or interlayer dielectric material for amorphous silicon or low temperature poly-silicon thin film transistors. A detailed summary of these chemistries is provided in U.S. Pat. No. 6,060,170; hereby incorporated by reference This patent teaches using poly(arylene ether) polymer compositions having aromatic groups grafted on the poly(arylene ether) backbone, which grafts allow for crosslinking of the polymers in a temperature range of 200 to 450° C. A further reduction in crosslinking temperature would, however, be desirable for dielectric and passivation materials for thin film transistors on flexible substrates or organic thin film transistors.

Display and imaging backplane or thin film transistor manufacturing require suitable coatings, especially gate dielectric insulating layers. These layers can have low or high dielectric constants and are required to have low leakage current values, good solvent resistance, and low moisture absorption. In addition, it is desired to provide the solutions that form these layers with unlimited storage stability at 25° C., storage stability at 40° C. sufficient to weather transportation in non-refrigerated vehicles, and cure temperatures of 130 to 180° C. or below 300° C. After cure, it is desirable to have solvent resistance, a dielectric constant below 3.5, and low moisture absorption.

All references cited herein are incorporated herein by reference in their entireties.

BRIEF SUMMARY OF THE INVENTION

The instant invention solves problems associated with conventional materials by providing a poly(arylene ether) polymer as a passivation or gate dielectric layer in thin film transistors, and methods for applying the layer or film in TFTs. This poly(arylene ether) polymer includes polymer repeat units of the following structure:

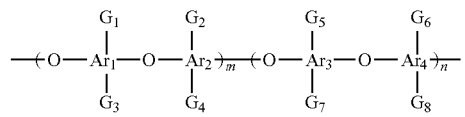

where $Ar_1$, $Ar_2$, $Ar_3$, and $Ar_4$ are identical or different arylene radicals, m is 0 to 1, n is 1–m, and where $G_{1-8}$ are individually: H, alkyl, alkylene, or functionalized alkylene, or the radicals represented by the structure below:

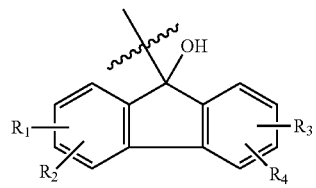

or mixtures thereof, wherein Z is the average number of G radicals per repeating unit of said polymer and Z is in the range of 0.1 to 4.0, where $R_1$, $R_2$, $R_3$, $R_4$ are individually H, alkyl, or alkoxy radical, wherein the alkoxy radical can have a normal or branched alkyl radical of $C_{1-8}$.

In one aspect of the invention, the poly(arylene ether) polymer consists essentially of non-functional repeating units wherein $Ar_1$, $Ar_2$, $Ar_3$, $Ar_4$ are individually arylene radicals selected from the consisting of:

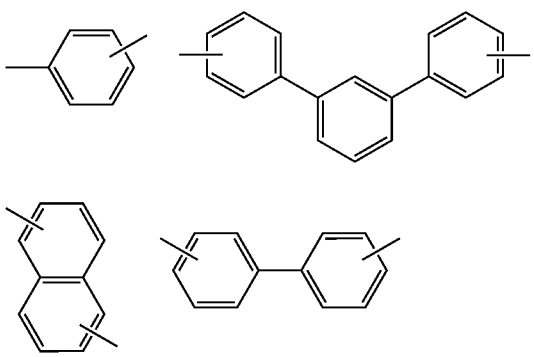

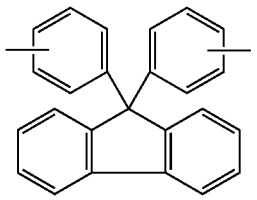

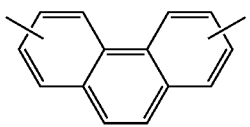

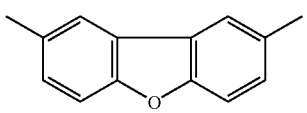

and mixtures thereof, but $Ar_1$ and $Ar_2$ or $Ar_3$ and $Ar_4$, other than the diradical 9,9-diphenylfluorene, are not isomeric equivalents. In some cases, the grafted polymer has repeating units of a structure:

The grafted polymer can comprise a repeating polymer unit:

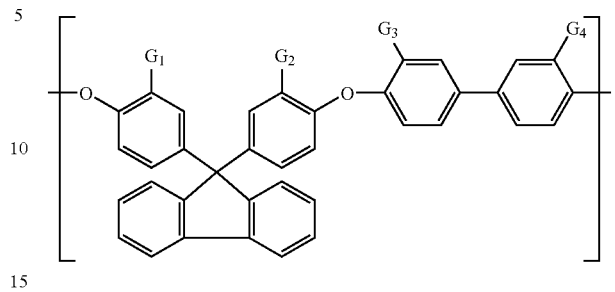

wherein grafts $G_{1-4}$ are individually selected from the group consisting of: H, alkyl, alkylene, functional alkylene, or the radicals represented below:

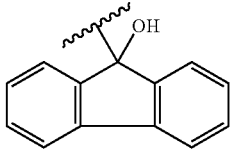

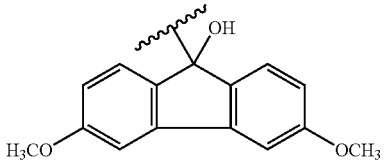

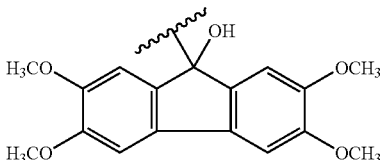

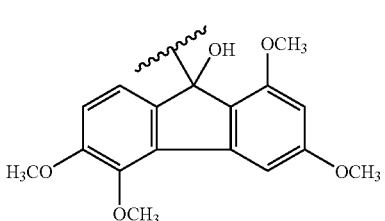

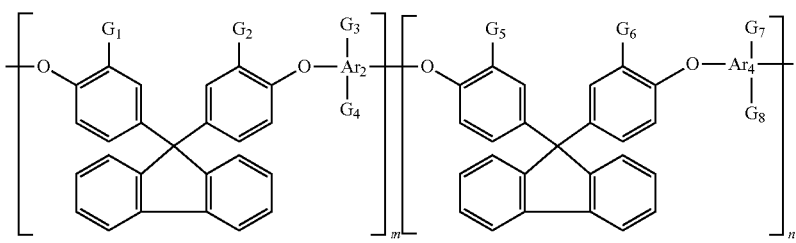

-continued

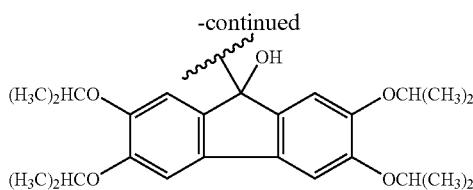

and mixtures thereof, where Z is the average number of G radicals per polymer unit and Z is in the range of 0.1 to 4.0. The grafted polymer can comprise a repeating polymer unit:

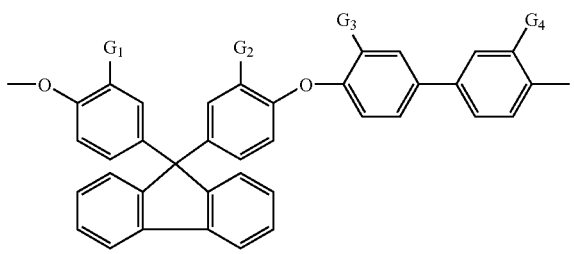

wherein $G_{1-4}$ are individually H, alkyl, alkylene, functional alkylene or:

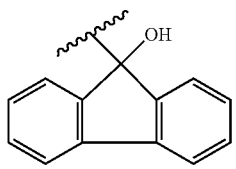

where Z is the average number of G radicals per polymer unit and Z is in the range of 0.1 to 4.0.

Also provided is an optional grafted poly(arylene ether) polymer for use as a passivation or gate dielectric layer for thin film transistors where each of the aryl radicals of the polymer repeat units is grafted to two unsaturated groups, G, as shown in the structure:

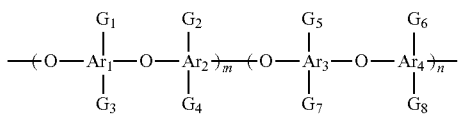

where $G_1$, $G_2$, $G_3$, $G_4$, $G_5$, $G_6$, $G_7$, and $G_8$ are identical or different non-aromatic unsaturated groups and these groups are adapted to crosslink at a curing temperature below 200° C. without producing volatiles during curing and without providing functional groups after curing.

The average number of unsaturated groups G per polymer repeat unit is 0.1 to 4.0. This average is calculated as the total number of unsaturated groups G per polymer divided by the total number of polymer repeat units per polymer.

Further provided is a gate dielectric or passivation composition for thin film transistor fabrication comprising the polymer, and optionally, a diluent, which does not afford a functional group or interfere with the mechanical or electrical properties of the composition.

Still further provided is a method for providing a gate dielectric substrate with a poly(arylene ether) film having a crosslinking temperature from about 130° C. to about 180° C., a dielectric constant below 3.5, a maximum moisture absorption of less than about 0.2 wt %. The method comprises applying the polymer of the invention to the gate dielectric substrate via either spin coating, slot extrusion, or printing and heating the polymer to a curing temperature at or below about 300° C. or usually, below about 250° C., or, below about 180° C.

Further provided is a multilayer electronic device that contains a film of grafted poly(arylene ether) polymer as the gate dielectric and/or passivation layer.

Still further provided is a thin film transistor device that contains a film of grafted poly(arylene ether) polymer as the gate dielectric and/or passivation layer.

Also provided is a printed thin film transistor device that contains a film of grafted poly(arylene ether) polymer as the gate dielectric and/or passivation layer.

The invention also relates to gate dielectric compositions (cured and uncured) comprising at least one polymer of the invention. The compositions, like the polymers themselves, can be useful as gate dielectrics and passivation layers. In addition to the at least one polymer, the compositions can further contain additional ingredients, including but not limited to, at least one solvent, one reactive solvent or diluent, at least one surfactant or at least one inorganic filler. Such compositions can be applied onto a substrate by any suitable method such as spin coating, printing, among other methods.

BRIEF DESCRIPTION OF SEVERAL VIEWS OF THE DRAWINGS

The invention will be described in conjunction with the following drawings which are not intended to limit the invention but to serve as representative examples wherein.

DETAILED DESCRIPTION OF THE INVENTION

Figure 1:
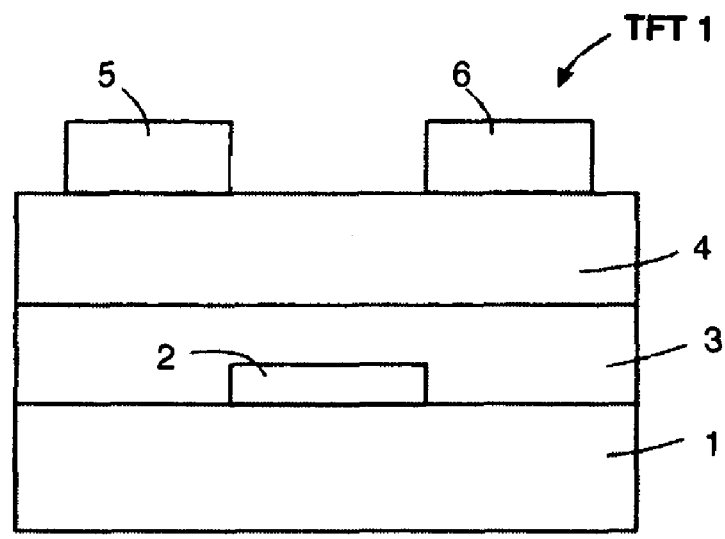
FIG. 1 is a drawing of a one embodiment of a multilayer electronic device that comprises a bottom gate thin film transistor containing the gate dielectric film of the invention.
Figure 2:
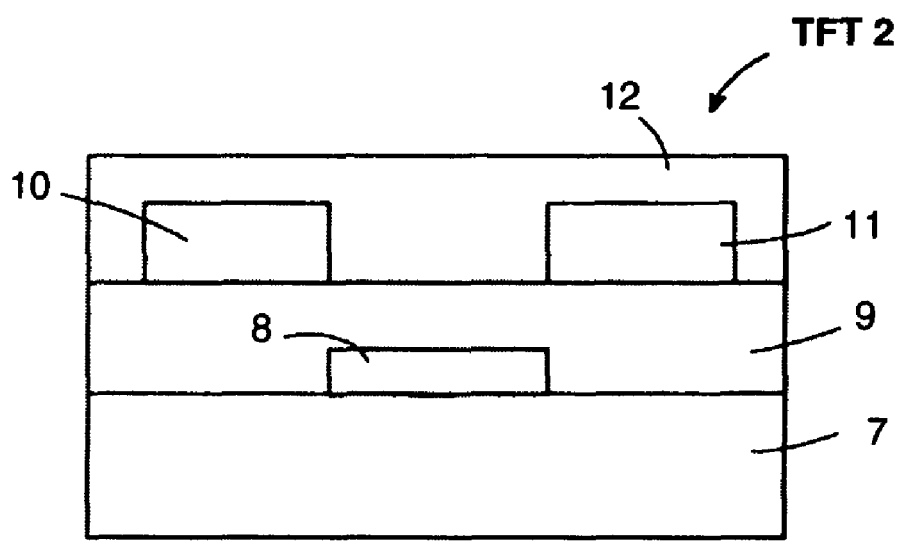
FIG. 2 is a drawing of a second embodiment of a multilayer electronic device that comprises a bottom gate thin film transistor containing the film of the invention.
Figure 3:
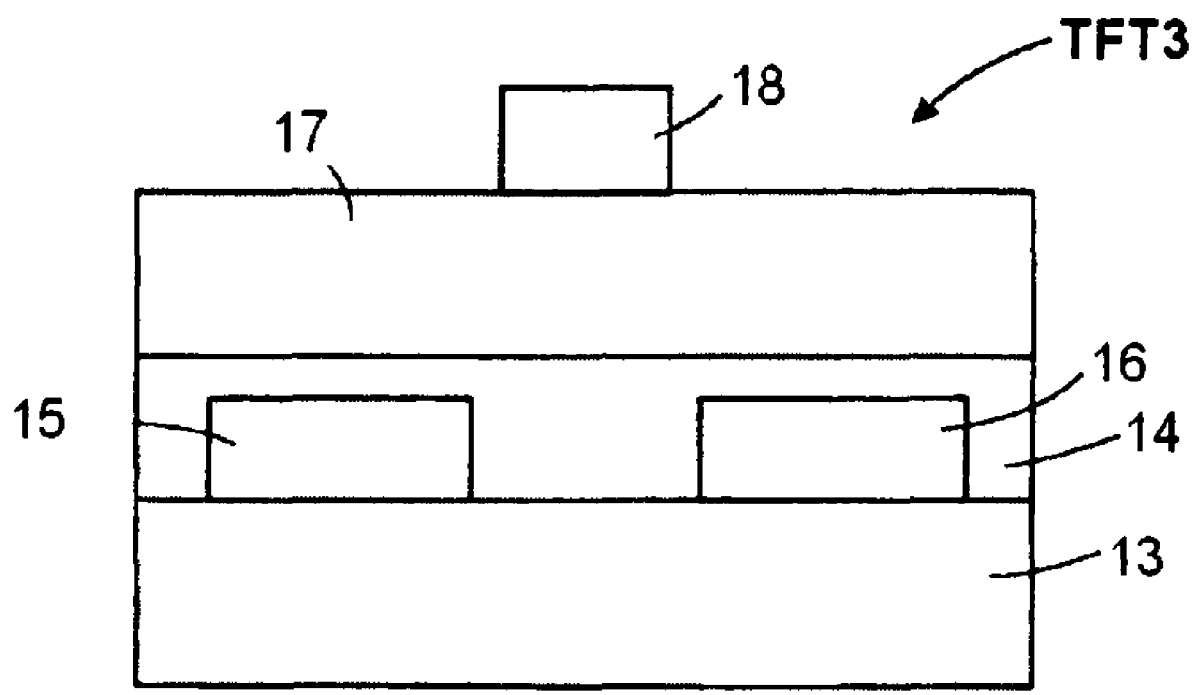
FIG. 3 is a drawing of a third embodiment of a multilayer electronic device that comprises a top gate thin film transistor containing the film of the invention.

The aforementioned drawbacks of the prior art are overcome by utilizing a polymer with the capability of being processed at low temperatures and exhibiting the other characteristics of a gate dielectric layer or passivation material for thin film transistors. The term "gate dielectric layer" is defined as a horizontally oriented insulating film or layer that is positioned between a horizontally oriented gate electrode and a horizontally oriented semiconductor layer such as shown in FIGS. 1-3. The gate dielectric layer can be in direct contact with at least one of the gate electrode and semiconductor layer, or at least one other layer can be positioned between the gate dielectric layer and at least one of the gate electrode and semiconductor layer.

The polymer of the invention is prepared by grafting onto poly(arylene ether) polymers either unsaturated or saturated groups (i.e., grafts (G)), which can crosslink at a curing temperature of less than 300° C., or usually below 250° C., or below about 180° C. The invention thus relates to specific poly(arylene ether) polymers and compositions containing them, their use as gate dielectrics and passivation layers, a microelectronic device comprising the same, a method of applying the polymers, and a gate dielectric or passivation layer comprising such poly(arylene ether) polymers, optionally in combination with a solvent or a reactive diluent. Curing can be accomplished by heating or by UV irradiation or a combination of the two.

The invention also relates to gate dielectric compositions (cured and uncured) comprising at least one polymer of the invention. The compositions, like the polymers themselves, are useful as gate dielectric or passivation layers. In addition to the at least one polymer, the compositions can further contain additional components, including but not limited to, at least one solvent, at least one reactive solvent or diluent, at least one plasticizer, at least one surfactant, or at least one inorganic filler. Such compositions can be applied onto a substrate by any suitable method such as spin coating, slot extrusion, printing, among other methods.

Polymers of the invention can comprise polymer repeat units represented by the following structure:

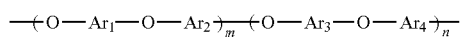

where $Ar_1$, $Ar_2$, $Ar_3$, and $Ar_4$ are identical or different aryl radicals, m is 0 to 1, n is 1−m, and at least one of the aryl radicals is grafted to at least one saturated or unsaturated group (G), which is not aromatic and is adapted to crosslink at a curing temperature less than about 200° C. without producing volatiles during curing and without providing functional groups after curing. In certain embodiments, each of the aryl radicals of the polymer repeat units is grafted to two unsaturated groups G, as shown in the following structure:

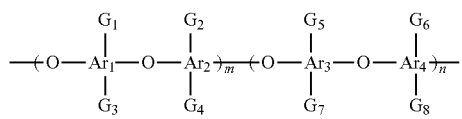

where $G_1$, $G_2$, $G_3$, $G_4$, $G_5$, $G_6$, $G_7$ and $G_8$ are identical or different unsaturated groups.

Polymers of the invention do not necessarily consist only of these polymer repeat units (i.e., G-containing polymer repeat units). In addition to embodiments wherein the polymer is built solely from the G-containing polymer repeat units, the invention also encompasses polymers comprising other polymer repeat units in addition to the G-containing polymer repeat units, such as, e.g., poly(arylene ether) polymer repeat units lacking any unsaturated grafts (i.e., G-free polymer repeat units). The sequence in which different polymer repeat units can be combined to form the polymer of the invention is not particularly limited. Thus, polymers of the invention can be, e.g., random, alternating, or block copolymers of the different polymer repeat units.

The average number of unsaturated groups G per polymer repeat unit can range from about 0.01 to about 8.0, usually about 0.1 to about 4. This average is calculated as the total number of unsaturated groups G per polymer divided by the total number of polymer repeat units per polymer.

In one aspect of the invention, the unsaturated groups G comprise olefins independently selected from the group consisting of an alkylene radical, an alkyldiene radical, an α-hydroxyalkylene radical and an α-hydroxyalkyldiene radical. In certain embodiments, the unsaturated groups G are derived from isoprene units. The unsaturated groups G are typically independently selected from the group consisting of:

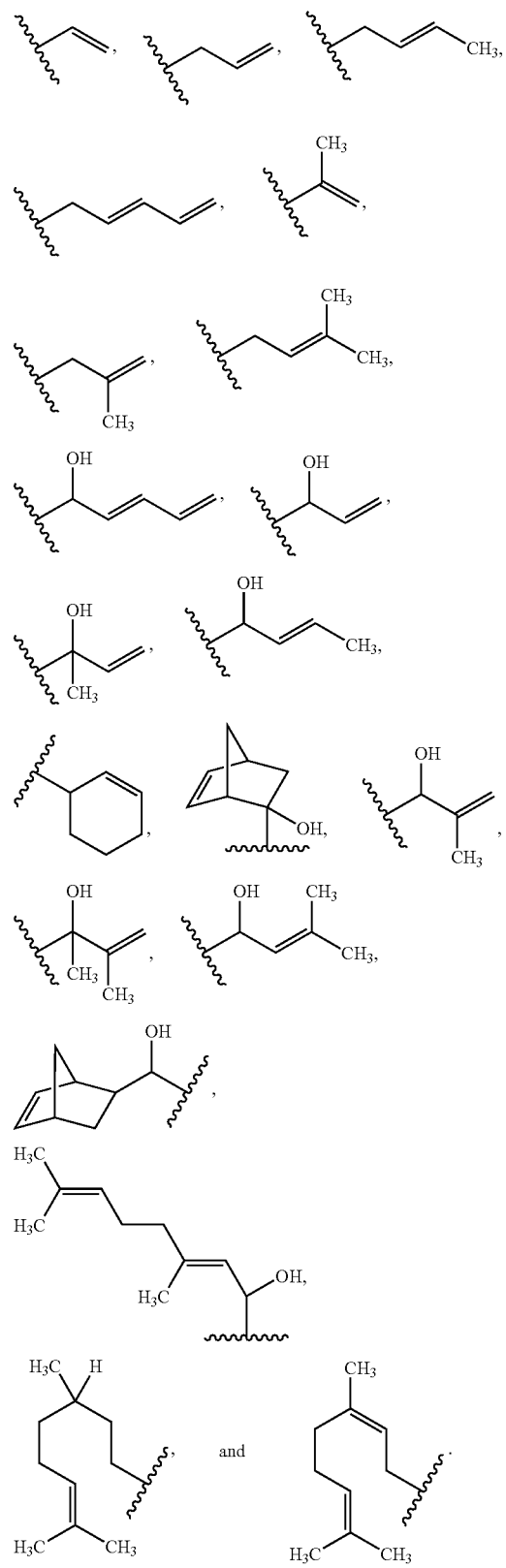

In another aspect of the invention, the aryl radicals $Ar_1$, $Ar_2$, $Ar_3$, and $Ar_4$ are independently selected from the group consisting of:

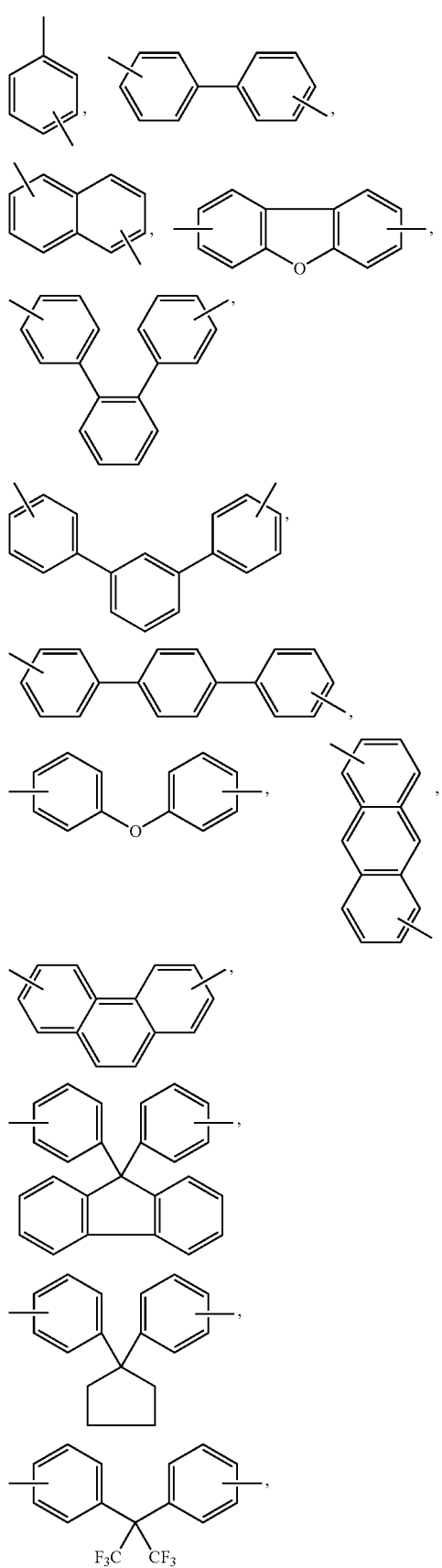
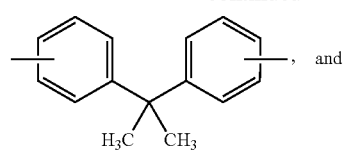
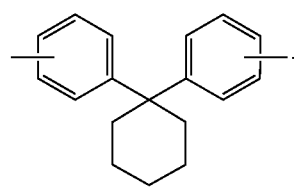
Usually at least one of aryl radicals $Ar_1$, $Ar_2$, $Ar_3$ and $Ar_4$ is (and in some cases, each of $Ar_1$ and $Ar_3$ is independently) 9,9-bis(4-hydroxyphenyl)-fluorene, 2,2-diphenylhexafluoropropane or 2,2-diphenylpropane.
An additional useful aryl radical comprises:
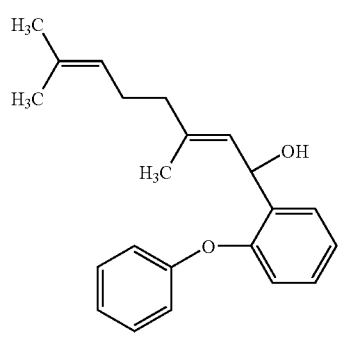
Useful examples of aryl radicals having unsaturated group(s) grafted thereto comprise:
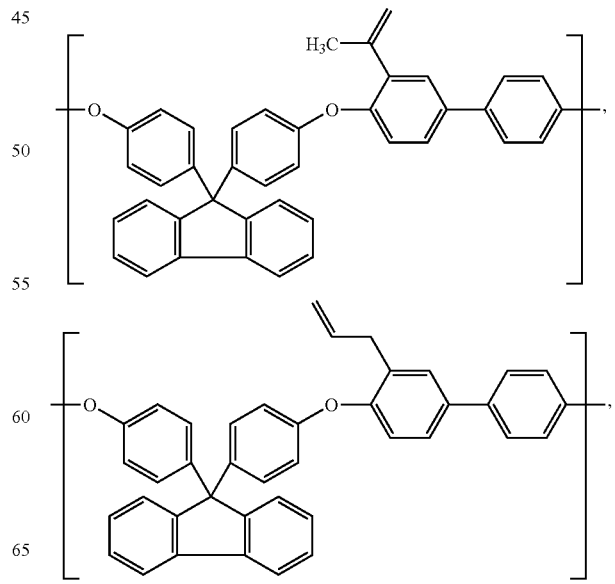

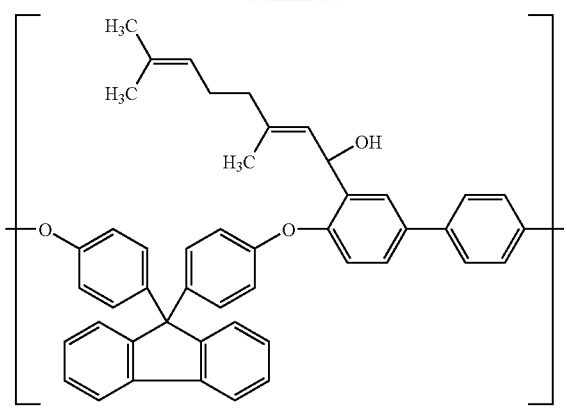
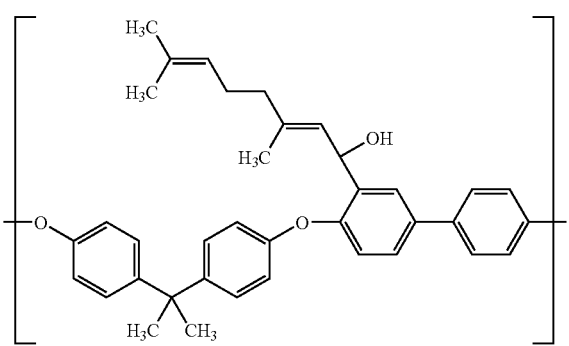
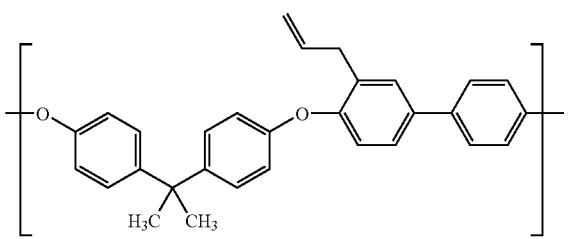
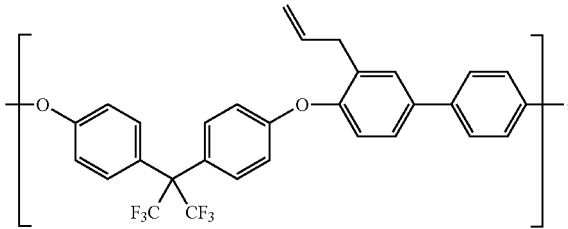
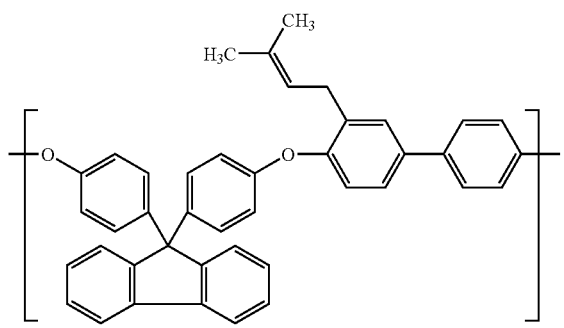
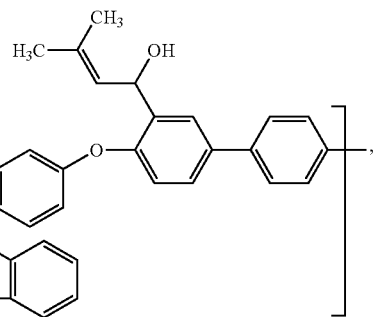
and the corresponding non-grafted polymer repeat units.
In one aspect of the invention, polymer repeat units of the invention comprise:
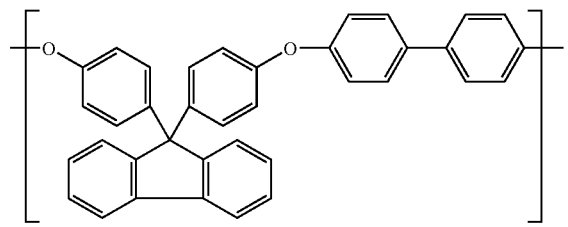
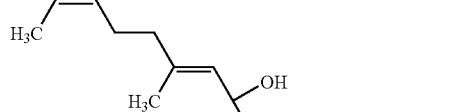
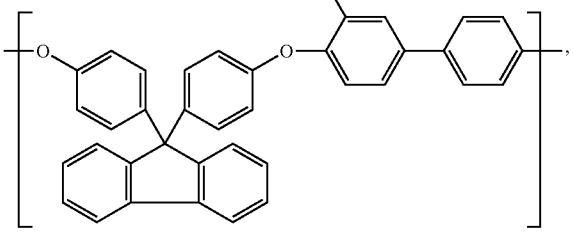
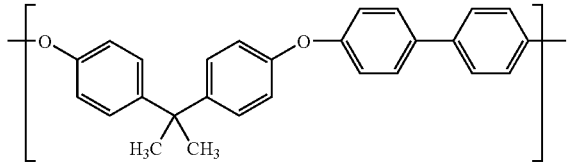
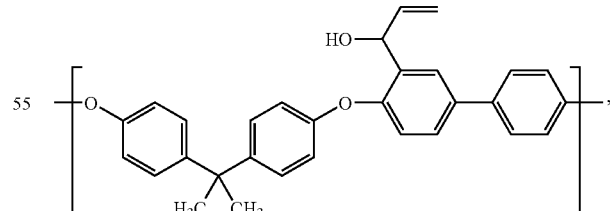
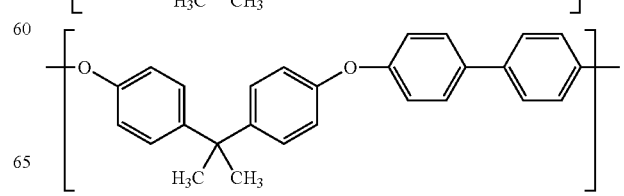

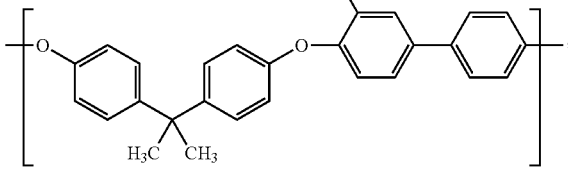
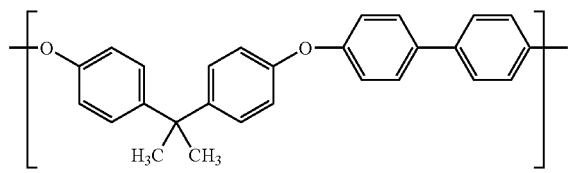
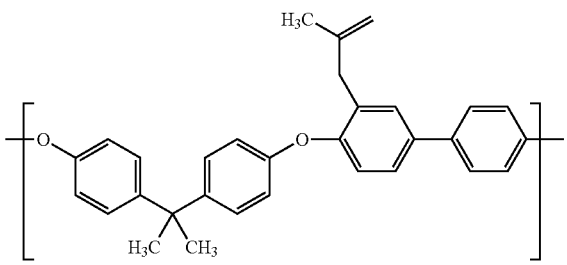
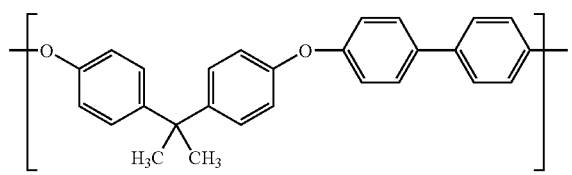
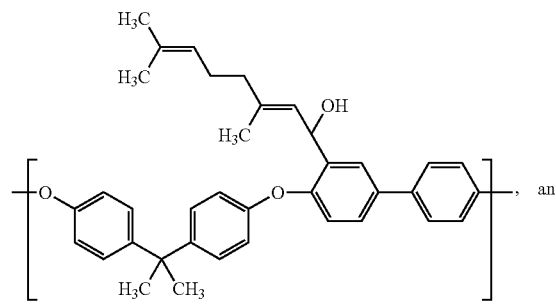
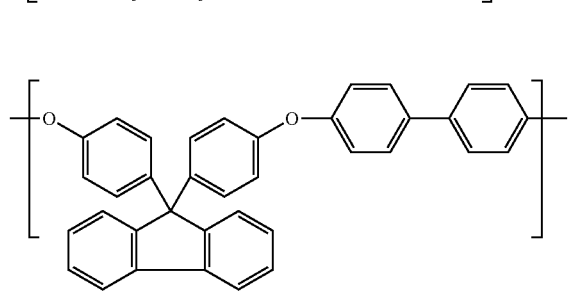
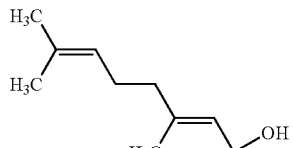
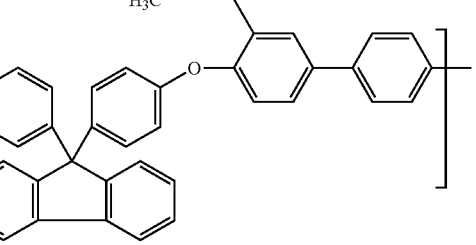
The grafted polymer can comprise a repeating polymer unit:
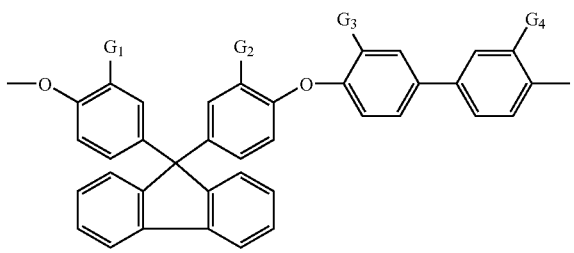
wherein grafts $G_{1-4}$ are individually selected from the group consisting of: H, alkyl, alkylene, functional alkylene, or the radicals represented below:
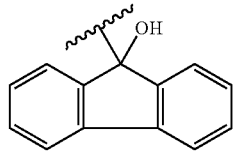
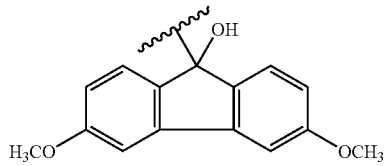
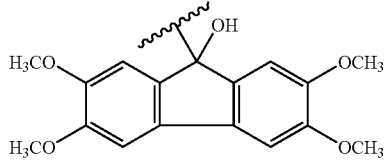
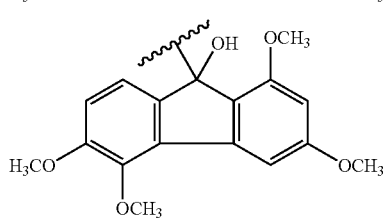

-continued

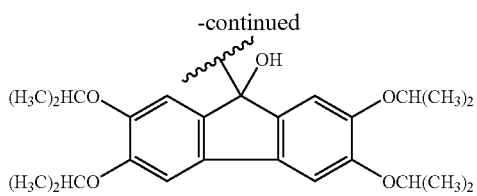

and mixtures thereof, where Z is the average number of G radicals per polymer unit and Z is in the range of about 0.1 to about 4.0. The grafted polymer can comprise a repeating polymer unit:

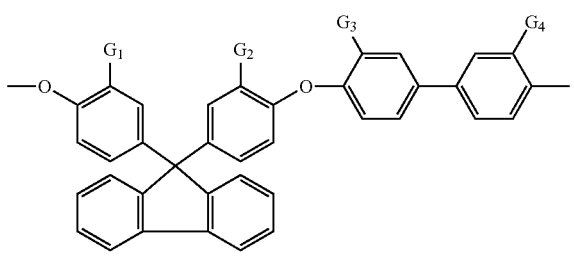

wherein $G_{1-4}$ are individually H, alkyl, alkylene, functional alkylene or:

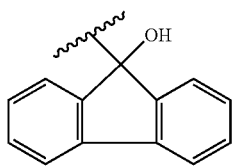

where Z is the average number of G radicals per polymer unit and Z is in the range of about 0.1 to about 4.0.

The invention encompasses the foregoing gate dielectric polymers in cured (crosslinked) condition and uncured condition. Polymers of the invention can be thermally cured by heating to a temperature of at least about 90° C., typically about 100° C. to less than about 250° C., usually about 130° C. to about 180° C. Optionally, crosslinking is induced in the presence of a catalyst selected from the group consisting of a mineral acid, an organic acid, a free radical starter, an azo-initiator and mixtures thereof.

Optionally, crosslinking is induced in the presence of sources of radiation in combination with thermal treatment where the radiation may be comprised of ultraviolet (UV) light (e.g., ranging from deep UV up to visible light), electron beam, X-ray, laser, and/or ion beams. The ionizing radiation source may have a wavelength range of from about 1 nanometer (nm) to about 700 nm, or more specifically from about 157 nm to about 500 nm. In embodiments wherein the ionizing radiation source comprises ultraviolet light, the exposure energy may range from about 1 to about 500 mJ/cm². However, the specific energy level can vary and is dependent upon the exposure tool and/or the components of the coating.

The invention also relates to gate dielectric compositions (cured and uncured) comprising at least one polymer of the invention. The compositions, like the polymers themselves, are useful as gate dielectrics and passivation layers. In addition to the at least one polymer, the compositions can further contain additional ingredients, including but not limited to, at least one solvent, at least one reactive diluent or solvent, at least one plasticizer, at least one surfactant, or at least one inorganic filler. Such compositions can be applied onto a substrate by any suitable method such as spin coating, printing, among other methods. Another method for applying the inventive compositions is disclosed in U.S. Patent Application Publication No. 2006/0079034; hereby incorporated by reference. The inventive compositions can be applied upon a wide range of substrates such as at least one member selected from the group of silicon, glass, plastic, metal, organic and inorganic semiconductors, and paper, among other substrates.

Reactive diluents and solvents can be incorporated into the composition upon cross-linking, but may not afford a functional group or interfere with the mechanical or electrical properties of the composition. Hence, reactive diluents can allow for a layer that can be applied as a thin film or via printing and can reduce the cost of overall system. Non-limiting examples of suitable reactive diluents comprise at least one member from the group of:

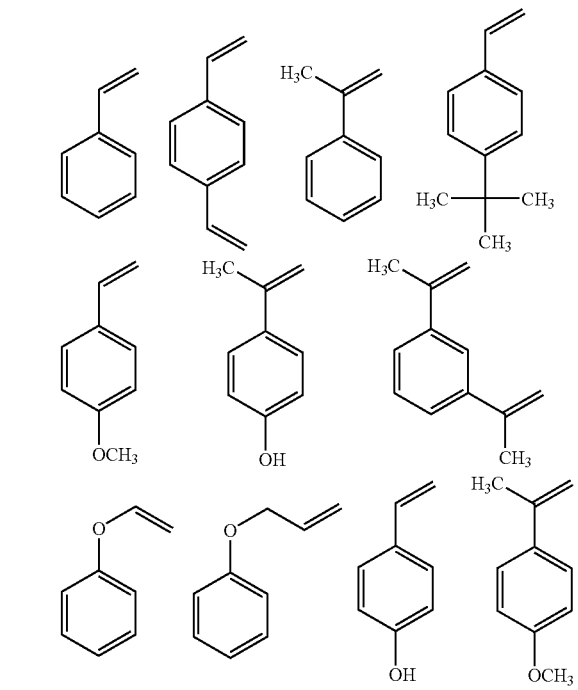

The amount of solvent typically ranges from about 2 wt % to about 95 wt % of the composition prior to drying or curing. While any suitable solvent can be used, examples of suitable solvents comprise at least one member selected from the group of toluene, xylene, tetrahydrofuran, cyclohexanone, and dichlorobenzene, among others.

The composition can also comprise at least one reactive solvent or diluent. While any suitable reactive solvent or diluent can be used, examples of suitable solvents comprise at least one member selected from the group of styrene, and divinylbenzene, among others. The amount of reactive solvent or diluent typically ranges from about 0.01 wt % to about 80 wt % of the composition.

The composition can also comprise at least one filler. While any suitable filler can be used, examples of suitable fillers comprise at least one inorganic filler selected from the group of silica and alumina, among others. The amount of filler typically ranges from about 0.01 wt % to about 50 wt % of the composition.

Polymers of the invention can be provided by modifying the poly(arylene ether) grafting process described in the inventor's earlier U.S. Pat. No. 6,060,170, hereby incorporated by reference, to graft to the poly(arylene ether) backbone non-aromatic unsaturated groups G, rather than the specified aromatic groups of the U.S. Pat. No. 6,060,170 patent.

The resulting polymers, when cured as discussed above, possess such desirable properties as a crosslink temperature from below about 250° C., a dielectric constant below 3.0 with frequency independence, and a maximum moisture absorption of less than 0.17 wt %. These polymers can also be used to produce a film or layer possessing a dielectric constant value of less than about 3; a leakage current value of less than about $1 \times 10^{-8}$ A/cm$^2$ and a breakdown voltage of greater than about 1.5 MV/cm. Consequently, the polymers and polymer-containing compositions of the invention are particularly suitable for use as gate dielectrics or passivation layers. The invention therefore further encompasses such gate dielectric or passivation layers and methods for applying them to substrates.

In addition the invention relates to any multilayer electronic device such as a thin film transistor device comprising the polymer or polymer-containing composition as defined above. In one aspect of the invention, the thin film transistor device contains the polymer in cured form as a gate dielectric or a passivation layer. The thin film transistor may be used for any number of electronic devices including, but not limited to, displays, sensors, imaging devices, RFID tags, memory devices, and other electronic devices utilizing thin film transistors.

Films formed in accordance with the instant invention typically have a thickness of about 0.05µ to about 1.0µ. Such films can achieve a capacitance of about 5 to about 500 nF/cm$^2$ and a dielectric constant of about 2.7 to about 3.5.

FIG. 1 illustrates a microelectronic device of one embodiment comprising a bottom gate thin film transistor (TFT1) containing the film of the instant invention. FIG. 1 shows TFT 1 comprising substrate 1 over which is applied a gate electrode 2 to give a gate dielectric substrate and a dielectric layer 3. Semiconductor layer 4 is deposited over dielectric layer 3 such that dielectric layer 3 is between the gate electrode and the semiconductor layer. In many embodiments of the invention, the gate dielectric layer 3 is also in direct contact with the substrate 1. This thin film transistor also includes a source electrode 5 and drain electrode 6. The inventive film comprises layer 3 of FIG. 1.

FIG. 2 illustrates a different bottom gate structure TFT, TFT2, including a substrate 7, a gate electrode 8 in contact with substrate 7, and a dielectric layer 9 formed over the substrate and the gate electrode. Two metal contacts, source electrode 10 and drain electrode 11, are deposited on top of the dielectric layer 9. Over and between the metal contacts 10 and 11 is a semiconductor layer 12. The inventive film comprises layer 9 of FIG. 2 which is deposited between the gate electrode and the semiconductor. A difference between FIG. 1 and FIG. 2, is that in FIG. 1, the gate dielectric layer is not in direct contact with the source and drain, but in FIG. 2 it is in contact with both the semiconductor layer and the gate electrode, FIG. 3 illustrates a top gate structure TFT, TFT3, which is similar to FIG. 2, but inverted to have the gate electrode as the top layer instead of the bottom layer. In this figure, the same components are present with layer 13 as the substrate, layer 14 as the semiconductor, 15 and 16 as the source and drain electrodes, with the gate dielectric layer 17 between the semiconductor and the top gate electrode 18. The gate dielectric layer 17 is between the semiconductor layer 14 and the gate electrode 18, but in this example, the gate dielectric is not in direct contact with the substrate layer 13.

Additional examples regarding usage of the inventive gate dielectric with TFTs can be found in U.S. Patent Application Publication No. 2005/0224922 A1; hereby incorporated by reference.

The invention will be illustrated in more detail with reference to the following Examples, but it should be understood that the present invention is not deemed to be limited thereto.

EXAMPLES

Leakage current density value (LCDV) measurements can be made using the Hg probe method:

The mercury probe was made by MSI electronics model Hg-401. The contact area of the mercury probe is 0.7 mm$^2$ with +/-2% of uncertainty. The power source and current meter is a Keithley 6517A. The mercury probe is placed in a Faraday cage to reduce the electric noise. The connection between the controller and mercury probe are BNC cables. The noise level of the system is less than 100 fA.

Thin films were coated on a low resistance silicon (Si) wafer (0.01 ohm) before the measurement. The thicknesses of the films were typically about 50 nm to about 500 nm. The film sample on Si was placed face down on the mercury probe so that the gate dielectric film was in contact with the mercury and a metal disk was in contact with the backside of the wafer. LCDV measurements were made by applying a constant voltage on the sample and measuring the current through the film. The reported LCDV is the current that was measured 3 minutes after applied a voltage to a film to avoid the charging current between the wafer and the insulated plate of the mercury probe.

LCDV leakage current density value measurement can also be made by using the metal dot method (e.g., to avoid background charging issue). Instead of using mercury as the contact electrode for the LCDV measurement, a small disk of metal film was deposited on top of the dielectric sample. A 0.5 mm and 1.0 mm shadow mask was used to aid in the deposit of 147 nm thick silver (Ag) dots by vapor deposition (Deposited at a rate of 4-5 Å/sec at 20 V under $4.3 \times 10^{-7}$ torr). The thickness of the deposited metal disk is about typically 100-200 nm. Typical deposit metals are silver, aluminum, or gold. A gold wire (1 mm in diameter) is used to contact the metal disk. The measurements were done by applying stepping voltages and measuring the current. The stepping voltage started at 0V and ended at 300V. Each step is 5V with holding time of 1 second. The leakage current was recorded at 1.5 MV/cm.

Example 1

Fabrication and Characterization of Thin Film Transistors

A solution for use as a gate dielectric layer was prepared by dissolving 10 grams of 9-fluorenone-graft poly(arylene ether) in 90 grams of cyclohexanone solvent. The polyarylene ether solution was filtered by through a 1µ filter. This filtered solution was deposited on a silicon wafer by spin coating at 1650 rpm for 1 minute and baked at 250° C. The capacitance of the resulting 0.5µ layer was measured as 5 nF/cm$^2$ via a mercury probe with a dielectric constant value of 3.0.

Example 2

A Thin Film Transistor with Poly(arylene Ether) as the Gate Dielectric

A bottom gate thin film transistor similar to FIG. 1 is fabricated by depositing an metal layer (Mo, Al, or Au) and then depositing a photoresist on top of the metal layer. The photoresist is patterned and developed to leave open the areas around where the gate electrode will be present and the metal areas adjacent to the gate electrode are etched away. Using a poly(arylene ether) solutions of Example 4, a gate dielectric layer is deposited onto the gate electrode via spin-coating this solution. On top of the gate dielectric layer is deposited an organic semiconductor layer such as P3HT or a doped polythiophene polymer. On top of the semiconductor is deposited a metal layer of Mo, Al, or Au which is then patterned in a manner similar to the gate electrode to give the source and drain electrodes on top of the semiconductor layer

Example 3

Preparation and Characterization of Poly(arylene ether) Gate Dielectric Layer for Use in the Thin Film Transistors A solution for use as a gate dielectric layer was prepared by dissolving 10 grams of 9-fluorenone-grafted poly(arylene ether) in 90 grams of cyclohexanone solvent. The dissolved grafted polyarylene ether) was filtered by through a 1μ filter. This filtered solution was deposited on a silicon wafer by spin coating at 3000 rpm for 40 seconds. Film 3a was then baked at 250° C. for 3 min. on a hot plate to give a 491 nm thick film. The leakage current density value (LCDV) for this film 3a on a silicon wafer was $3.0 \times 10^{-10}$ A/cm$^2$ at 1.5 MV/cm when measured in N$_2$ and the LCDV was $4.7 \times 10^{-10}$ A/cm$^2$ at 1.5 MV/cm when measured in air at constant temperature and humidity (CTH) set at 71° F. and 42% humidity. Film 3b was then baked at 135° C. for 3 min. on a hot plate to give a 522 nm thick film. The leakage current density value (LCDV) for this film 2b on a silicon wafer was $3.0 \times 10^{-10}$ A/cm$^2$ at 1.5 MV/cm when measured in N$_2$. LCDV values were obtained via a mercury probe.

Example 4

Preparation and Characterization of Low Temperature Cured Poly(arylene ether) for Use in Thin Film Transistors A solution for use as a gate dielectric layer was prepared by dissolving 0.5 grams of citral-grafted poly(arylene ether) (Citral/poly(arylene ether) ratio=0.83:1) in 8.93 grams of cyclohexanone solvent. The citral poly(arylene ether) solution in cyclohexanone was filtered through a 3 μm PTFE filter followed by passing through a 0.45 μm PVDF filter. This filtered solution was deposited on a silicon wafer by spin coating it at 1500 rpm for 1 minute to give film 4a and the coating procedure was repeated to give film 4b. Film 4a was then baked at 180° C. for 60 min. on a hot plate to give a 356 nm thick film. Film 4a was determined to be crosslinked under the heating conditions above by measuring the film thickness before (356 nm) and after (356 nm) exposure to dichlorobenzene for 15 minutes, with a water wash and a 180C. bake for 6 minutes carried out after the solvent exposure. Film 4b was baked at 250° C. for 6 min. on a hot plate to give a 365 nm thick film. The leakage current density value (LCDV) for this film 4b on a silicon wafer was $1.5 \times 10^{-9}$ A/cm$^2$ at 1.5 MV/cm when measured in air at constant temperature and humidity (CTH: 71° F. and 42% humidity). LCDV values were obtained via a 0.5 mm and 1.0 mm silver metal dots.

Example 5

Viscosity Measurements on Low Temperature Curing, Ink-Jet Capable Poly(arylene Ether) Gate Dielectric Solution Viscosity measurements were run at two different polymer solution concentrations which were prepared by dissolving 0.506 grams of citral-graft poly(arylene ether) (Citral/poly(arylene ether) ratio=0.63:1) in 8.5 grams of cyclohexanone solvent to give a 5.6 weight % solution, 5a and by dissolving 0.506 grams of this same polymer in 10.73 grams of cyclohexanone solvent to give a 4.5 weight % solution, 5b. The following viscosities were obtained from these solutions. These solutions have a viscosity within a range that is useful for deposition via ink jet printing.

| Temperature (° C.) | Viscosity (cps) Solution 5a | Viscosity (cps) Solution 5b |
| --- | --- | --- |
| 20 | 18.6 | 12.4 |
| 25 | 16.7 | 11.2 |
| 30 | 14.8 | 10.1 |
| 35 | 13.2 | 9.1 |
| 40 | 11.9 | 8.2 |
| 45 | 10.7 | 7.5 |
| 50 | 9.7 | 6.7 |

Example 6

Preparation and Characterization of Low Temperature and UV Cured Poly(arylene Ether) Polymer Gate Dielectric A solution for use as a gate dielectric layer was prepared by dissolving 0.5 grams of citral-graft poly(arylene ether) (citral/poly(arylene ether) ratio=0.42:1) in 8.93 grams of cyclohexanone solvent. The citral poly(arylene ether) solution was filtered through a 0.2 μm PTFE filter. This filtered solution was deposited on a silicon wafer by spin coating at 1500 rpm for 1 minute to give film 6a and this deposition procedure was repeated five times to produce films 6b, 6c, 6d, 6e, and 6f. Film 6a was baked at 250° C. for 6 minutes on a hot plate to give a 341 nm thick film. Film 6a was determined to be crosslinked under the heating conditions above by measuring the film thickness before (341 nm) and after (343 nm) exposure to dichlorobenzene for 15 minutes, with a water wash and a 250 C. bake for 6 minutes carried out after the solvent exposure. Film 6b was baked at 185° C. for 60 minutes on a hot plate to give a 353 nm thick film. The resulting polymer layer was only partially crosslinked under these conditions as evidenced by Film 6b measuring 175 nm (50% loss in thickness) after exposure to dichlorobenzene for 15 minutes followed by a wash with DI water and a bake at 185° C. for 6 minutes. Film 6c was exposed to broad band UV for 20 seconds then baked at 185° C. for 60 minutes on a hot plate to give a 338 nm thick film. We determined that this polymer was crosslinked under these conditions as evidenced by Film 6c measuring 338 nm after its exposure to dichlorobenzene for 15 minutes. Film 6d was exposed to a broad band UV lamp for 1 minute then baked at 180° C. for 30 minutes on a hot plate to give a 334 nm thick film. We determined that this polymer was crosslinked under these conditions as evidenced by Film 6d measuring 334 nm after exposure to dichlorobenzene for 15 minutes followed by a wash with DI water and a bake at 180° C. for 3 minutes. Film 6e was exposed to a broad band UV lamp for 1 minute then baked at 180° C. for 7.5 min. on a hot plate to give a 334 nm thick film. We determined that this polymer was crosslinked under these conditions as evidenced by Film 6e measuring 334 nm after exposure to dichlorobenzene for 15 minutes followed by a wash with DI water and a bake at 180° C. for 3 minutes. Film 6f was exposed to a broad band UV lamp for 1 minute then baked at 150° C. for 7.5 min. on a hot plate to give a 341 nm thick film. We determined that this polymer was crosslinked under these conditions as evidenced by Film 6f measuring 339 nm after exposure to dichlorobenzene for 15 minutes followed by a wash with DI water and a bake at 150° C. for 3 minutes.

| Film | UV Exposure (seconds) | Bake Temp (° C.) | Bake Time (minutes) | Thickness before chemical exposure (nm) | Thickness after chemical exposure (nm) | % Thickness Change |
|---|---|---|---|---|---|---|
| 6a | 0 | 250 | 6 | 340.8 | 342.9 | +0.63 |
| 6b | 0 | 185 | 60 | 352.7 | 174.7 | −50.50 |
| 6c | 20 | 185 | 60 | 338.0 | 337.8 | −0.04 |
| 6d | 60 | 180 | 30 | 334.0 | 334.0 | +0.01 |
| 6e | 60 | 180 | 7.5 | 334.2 | 334.1 | −0.04 |
| 6f | 60 | 150 | 7.5 | 340.9 | 339.2 | −0.48 |

Although certain aspects of the invention are illustrated and described herein with reference to given embodiments, it is not intended that the appended claims be 15 limited to the details shown. Rather, it is expected that various modifications may be made in these details by those skilled in the art, which modifications may still be within the spirit and scope of the claimed subject matter and it is intended that these claims be construed accordingly.

The invention claimed is:

1. A gate dielectric layer or passivation layer in a thin film transistor wherein the layer comprises at least one polymer comprising repeat units of the following structure:

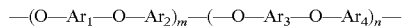

where $Ar_1$, $Ar_2$, $Ar_3$, and $Ar_4$ are identical or different aryl radicals, m is 0 to 1, n is 1-m, and at least one of the aryl radicals is grafted to at least one unsaturated or saturated group that is non-aromatic and is adapted to crosslink at a curing temperature below 250° C. without producing volatiles during curing and without providing functional groups after curing.

2. The gate dielectric or passivation layer of claim 1 capable of being cured at temperatures less than about 200° C.

3. The gate dielectric or passivation layer of claim 1 capable of being cured at about 180° C.

4. The gate dielectric or passivation layer of claim 1 capable of being cured by a method comprising exposing the layer to a source of radiation and heating to at temperature of less than about 180° C.

5. The gate dielectric or passivation layer of claim 4 wherein the exposing comprises exposing the layer to a source of radiation comprising at least one members elected from the group consisting of electron beam, photon, ultraviolet light, visible light, X-ray, thermal, and combinations thereof.

6. The gate dielectric or passivation layer of claim 5, wherein the exposing comprising exposing the layer to ultraviolet or visible light.

7. A poly(arylene ether) polymer for use as a gate dielectric or passivation layer for a thin film transistor wherein the polymer comprises polymer repeat units of the following structure:

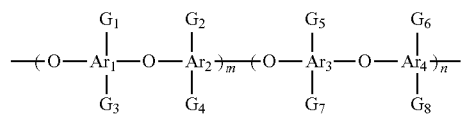

where $G_1$, $G_2$, $G_3$, $G_4$, $G_5$, $G_6$, $G_7$ and $G_8$ are identical or different and are H or aryl-containing groups:

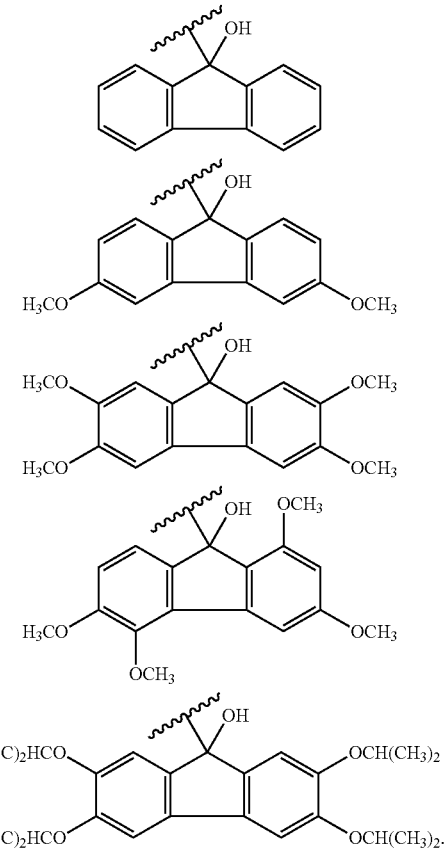

8. The polymer of claim 7 wherein said polymer has a dielectric constant lower than about 3.0.

9. The polymer of claim 7 wherein said polymer has a dielectric constant higher than about 2.7.

10. The gate dielectric or passivation layer of claim 1 wherein the thin film transitor comprises:
at least one gate electrode;
the gate dielectric layer
at least one source electrode;
at least one drain electrode;
at least one semiconductor layer;

wherein the gate dielectric layer has a dielectric constant of greater than about 2.7.

11. The gate dielectric or passivation layer of claim 1, wherein the poly(arylene ether) polymer is grafted.

12. The gate dielectric or passivation layer of claim 11, wherein the poly(arylene ether) polymer is grafted to at least one unsaturated group.

13. The gate dielectric or passivation layer of claim 11, wherein the poly(arylene ether) polymer is grafted to more than one unsaturated group.

14. The gate dielectric or passivation layer of claim 11, wherein the poly(arylene ether) polymer is grafted with an aryl-containing graft.

15. The gate dielectric or passivation layer of claim 1, wherein the poly(arylene ether) is not fluorinated.

16. The gate dielectric or passivation layer of claim 1, wherein the polymer repeat units comprise poly(arylene ether) polymer repeat units having the following structure:

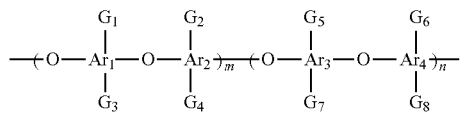

where $G_1$, $G_2$, $G_3$, $G_4$, $G_5$, $G_5$, $G_7$ and $G_8$ are identical or different species of the at least one unsaturated group.

17. The gate dielectric or passivation layer of claim 16, wherein the poly(arylene ether) polymer contains an average number of unsaturated groups per polymer repeat unit of 0.1 to 4.

18. The gate dielectric or passivation layer of claim 16, wherein the poly(arylene ether) polymer contains an average number of unsaturated groups per polymer repeat unit of 1 to 2.

19. The gate dielectric or passivation layer of claim 16, wherein the poly(arylene ether) polymer comprises at least one unsaturated group comprising at least one member selected from the group consisting of an alkylene radical, an alkyldiene radical, an α-hydroxyalkylene radical and an α-hydroxyalkyldiene radical.

20. The poly(arylene ether) polymer of claim 7 wherein the poly(arylene ether) polymer comprises at least one unsaturated group comprising at least one member selected from the group consisting of:

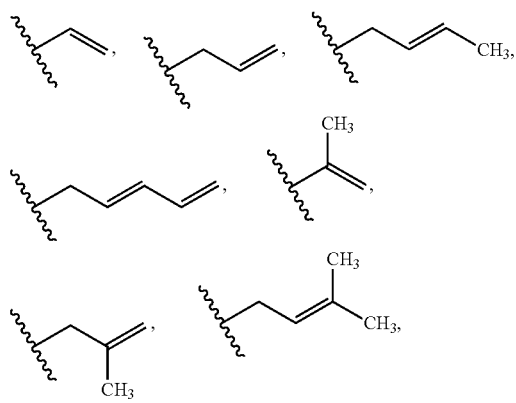

21. The gate dielectric or passivation layer of claim 16, wherein the poly(arylene ether) polymer contain the aryl radicals that are independently selected from the group consisting of:

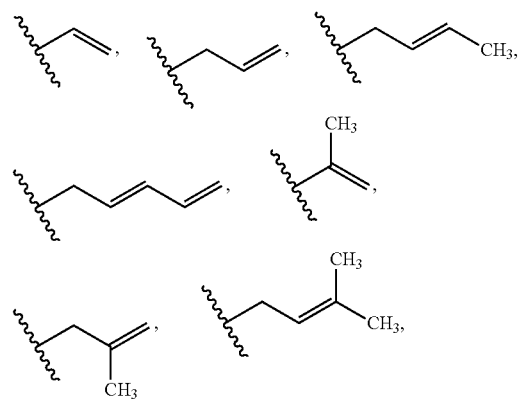

-continued

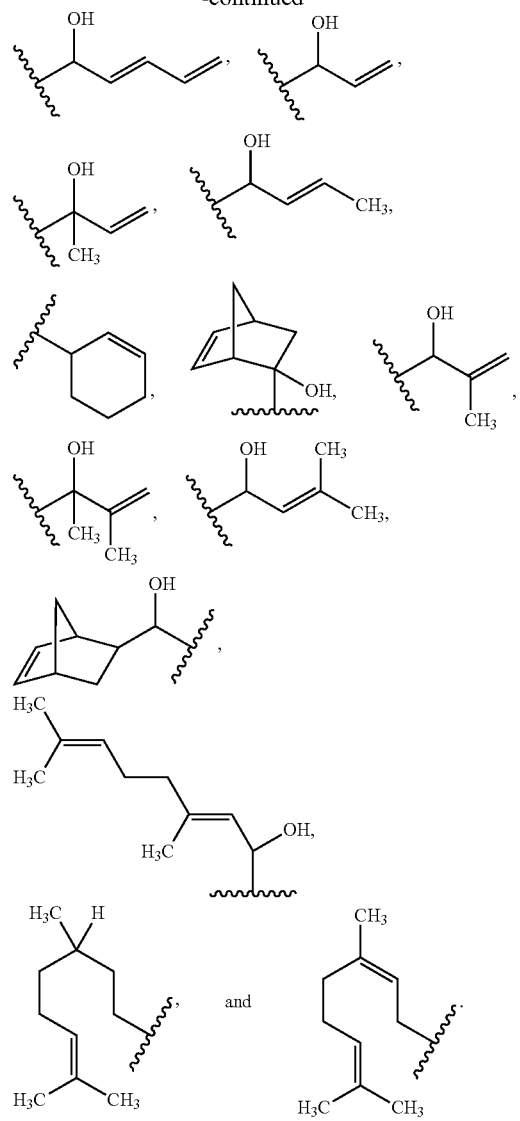

-continued
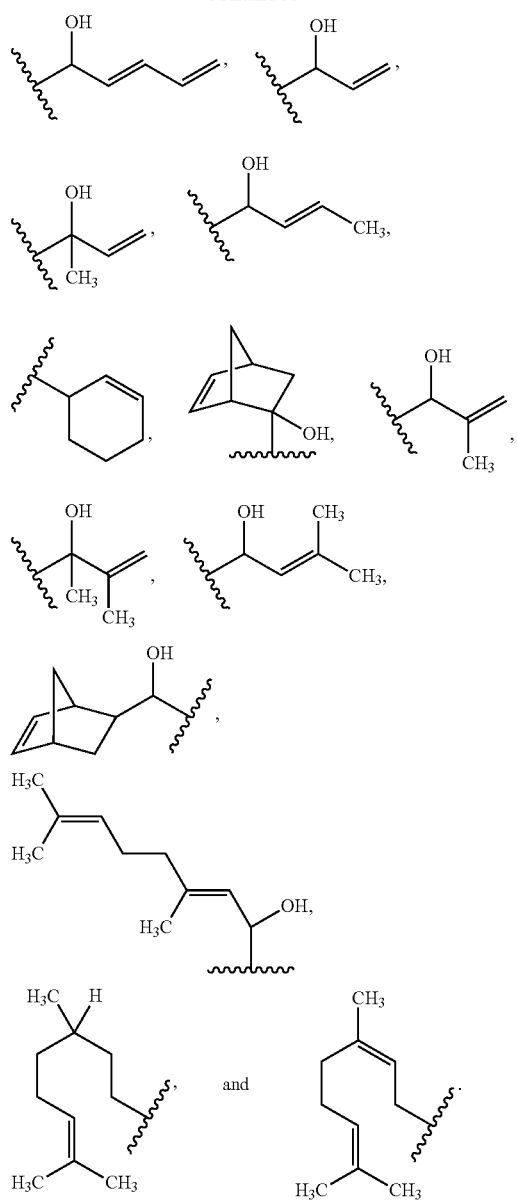
22. The gate dielectric or passivation layer of claim 16, wherein the poly(arylene ether) polymer contain the aryl radicals that are independently selected from the group consisting of:
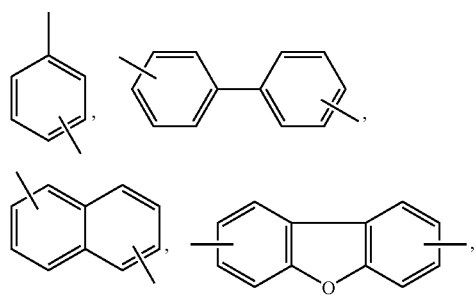
-continued
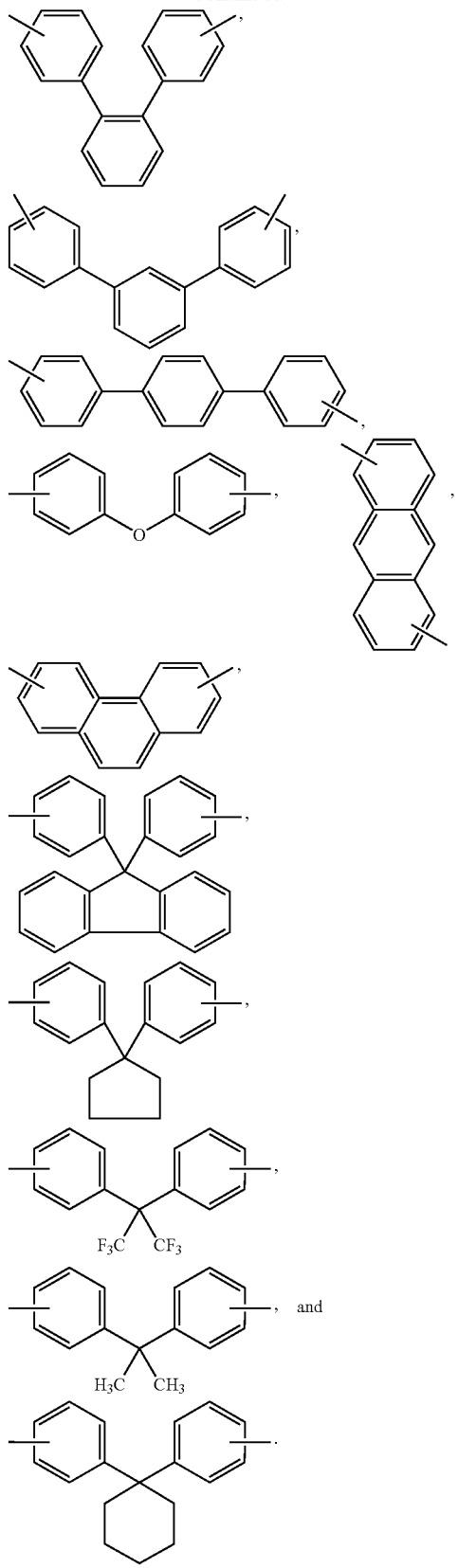
23. The gate dielectric or passivation layer of claim 16, wherein the poly(arylene ether) polymer comprises at least one of the aryl radical that is selected from the group consisting of 9,9-bis(4-hydroxyphenyl)-fluorene, 2,2-diphenylhexafluoropropene and 2,2-diphenylpropene.

24. The gate dielectric or passivation layer of claim 16, wherein the poly(arylene ether) polymer contain the average number of unsaturated groups per polymer unit is more than 0.1 and not more than 1, and the poly(arylene ether) polymer comprises one of the following polymer repeat units:

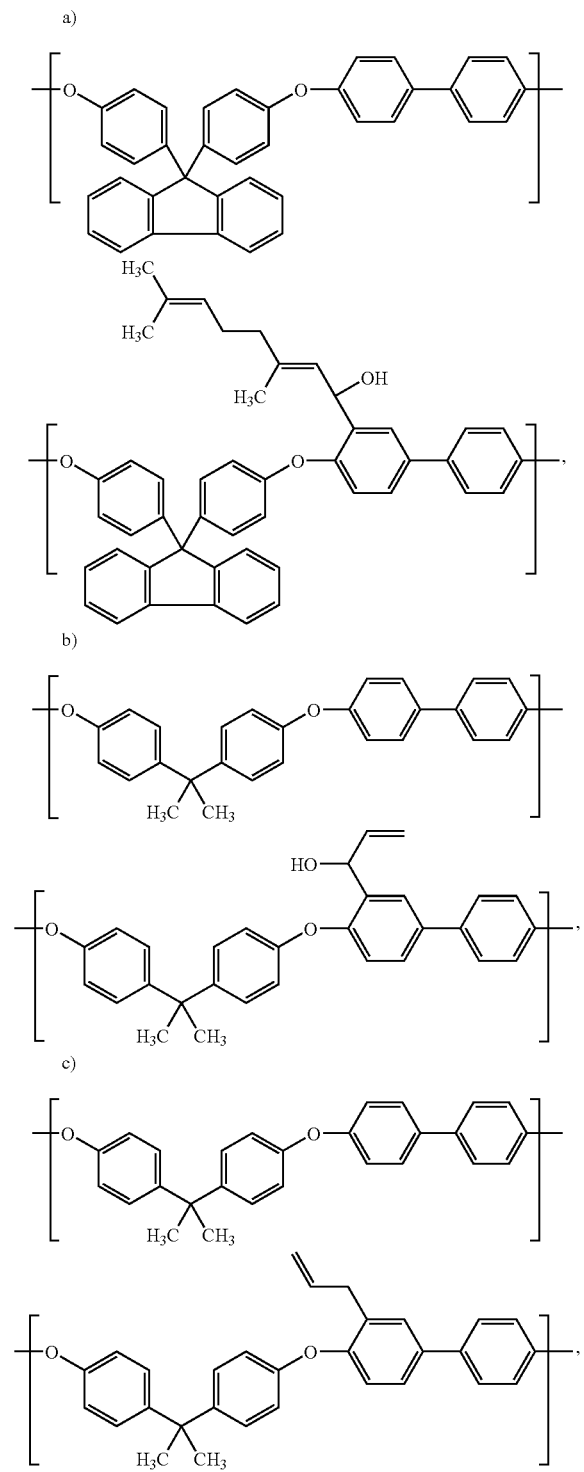

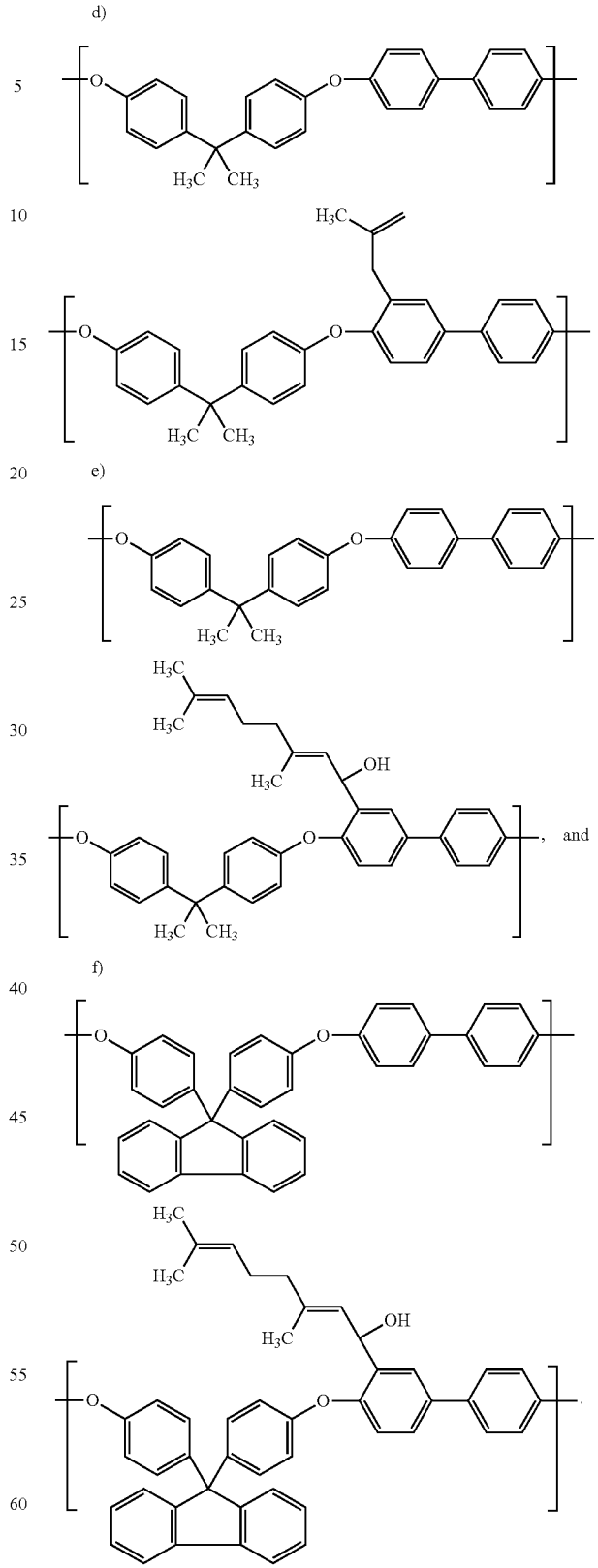

25. The gate dielectric or passivation layer of claim 16, wherein the poly(arylene ether) polymer contains at least one of the aryl radicals:

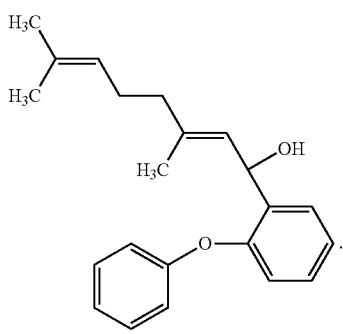

26. The gate dielectric or passivation layer of claim 1, wherein the gate dielectric layer has a capacitance of greater than about 5 nF/cm².

27. The gate dielectric or passivation layer of claim 16, wherein the poly(arylene ether) polymer is present in cured form, said cured form of the polymer having a curing temperature from about 130 to about 180° C., a dielectric constant below about 3.0, and a maximum moisture absorption of less than about 0.2 wt %.

28. The gate dielectric or passivation layer of claim 1 wherein the thin film transitor comprises:
- a substrate;
- At least one gate electrode;
- the gate dielectric layer;
- At least one source electrode;
- At least one drain electrode; and
- At least one semiconductor layer in contact with the source and drain electrodes, wherein the gate dielectric layer has a dielectric constant of greater than about 2.7 and a capacitance of greater than about 5 nF/cm².

* * * * *